United States Patent
Kim

(10) Patent No.: US 12,278,181 B2
(45) Date of Patent: Apr. 15, 2025

(54) INTEGRATED CIRCUITS INCLUDING VIA ARRAY AND METHODS OF MANUFACTURING THE SAME

(71) Applicant: Samsung Electronics Co., Ltd., Suwon-si (KR)

(72) Inventor: Yong-durk Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 960 days.

(21) Appl. No.: 17/188,414

(22) Filed: Mar. 1, 2021

(65) Prior Publication Data
US 2021/0183768 A1 Jun. 17, 2021

Related U.S. Application Data

(63) Continuation of application No. 16/153,153, filed on Oct. 5, 2018, now Pat. No. 10,964,639.

(30) Foreign Application Priority Data

Oct. 20, 2017 (KR) .................. 10-2017-0136613
May 14, 2018 (KR) .................. 10-2018-0055045

(51) Int. Cl.
| | |
|---|---|
| G06F 30/392 | (2020.01) |
| G06F 30/394 | (2020.01) |
| H01L 23/522 | (2006.01) |
| H01L 23/528 | (2006.01) |

(52) U.S. Cl.
CPC ........ *H01L 23/5283* (2013.01); *G06F 30/392* (2020.01); *G06F 30/394* (2020.01); *H01L 23/5226* (2013.01); *H01L 23/528* (2013.01); *H01L 23/5286* (2013.01)

(58) Field of Classification Search
CPC ... G06F 30/392; G06F 30/394; H01L 23/5226
See application file for complete search history.

(56) References Cited

U.S. PATENT DOCUMENTS

| | | | |
|---|---|---|---|
| 6,779,167 B2 * | 8/2004 | Igarashi | H01L 23/5226 257/E23.145 |
| 6,785,877 B1 | 8/2004 | Kozai | |
| 7,005,746 B2 | 2/2006 | Kumagai | |
| 7,007,258 B2 | 2/2006 | Le | |
| 7,200,831 B2 | 4/2007 | Kitabayashi et al. | |
| 7,245,019 B2 | 7/2007 | Murata | |
| 7,299,443 B2 | 11/2007 | Kumagai | |

(Continued)

FOREIGN PATENT DOCUMENTS

| | | |
|---|---|---|
| CN | 1612323 A | 5/2005 |
| CN | 101494212 A | 7/2009 |

(Continued)

*Primary Examiner* — Daniel Luke
(74) *Attorney, Agent, or Firm* — Myers Bigel, P.A.

(57) ABSTRACT

An integrated circuit (IC) includes a via stack, and the via stack includes via arrays including a plurality of vias at the same level. A plurality of vias of a via array are arranged at intersections between tracks of adjacent conductive layers and arranged along a central line between the tracks. Also, a via overlap extends parallel to tracks of a conductive layer. Thus, the number of tracks sacrificed by the via array may be reduced, and the IC may have enhanced performance and a reduced area due to improved routability.

18 Claims, 18 Drawing Sheets

(56) References Cited

U.S. PATENT DOCUMENTS

| | | |
|---|---|---|
| 7,424,695 B2 | 9/2008 | Tamura |
| 7,444,614 B2 | 10/2008 | Maeno |
| 7,587,696 B2 | 9/2009 | Nakamoto |
| 7,694,260 B2 | 4/2010 | Tamiya |
| 8,006,205 B2 | 8/2011 | Yoshioka |
| 8,171,446 B2 | 5/2012 | Inoue |
| 8,234,594 B2 | 7/2012 | Anderson |
| 8,418,111 B2 * | 4/2013 | Chen .................. G03F 7/70466 716/139 |
| 8,751,992 B2 | 6/2014 | Utsumi et al. |
| 8,803,206 B1 | 8/2014 | Or-Bach et al. |
| 9,159,716 B2 * | 10/2015 | Hsu ........................ H01L 23/36 |
| 9,520,358 B2 | 12/2016 | Meng et al. |
| 9,653,413 B2 * | 5/2017 | Frederick, Jr. ........ G06F 30/394 |
| 10,038,006 B2 | 7/2018 | Furihata et al. |
| 10,056,405 B2 | 8/2018 | Sunamura |
| 10,262,981 B2 * | 4/2019 | Chang ................ H01L 23/5226 |
| 2002/0074660 A1 | 6/2002 | Fukasawa |
| 2003/0015800 A1 | 1/2003 | Fukasawa |
| 2003/0067075 A1 | 4/2003 | Fukasawa |
| 2005/0110130 A1 | 5/2005 | Kitabayashi et al. |
| 2009/0176124 A1 | 7/2009 | Hong et al. |
| 2010/0125821 A1 | 5/2010 | Tajima |
| 2010/0229140 A1 * | 9/2010 | Strolenberg .......... G06F 30/392 716/52 |
| 2013/0049215 A1 | 2/2013 | Larsen |
| 2016/0126180 A1 | 5/2016 | Meng et al. |
| 2016/0211212 A1 * | 7/2016 | Chao .................. H01L 23/5226 |
| 2017/0179154 A1 | 6/2017 | Furihata et al. |
| 2017/0236778 A1 | 8/2017 | Gonzalez Jimenez |

FOREIGN PATENT DOCUMENTS

| | | |
|---|---|---|
| CN | 107148670 A | 9/2017 |
| CN | 108377660 A | 8/2018 |
| JP | 06326278 | 11/1994 |
| JP | 2001015602 A | 1/2001 |
| JP | 2002184950 A | 6/2002 |
| JP | 2009054760 A | 3/2009 |
| JP | 2010040661 A | 2/2010 |
| JP | 2012004574 A | 1/2012 |
| JP | 2013058615 A | 3/2013 |
| JP | 5640438 B2 | 11/2014 |
| JP | 2017069513 A | 4/2017 |
| KR | 20020046899 A | 6/2002 |
| KR | 20030022006 A | 3/2003 |

\* cited by examiner

INTEGRATED CIRCUITS INCLUDING VIA ARRAY AND METHODS OF MANUFACTURING THE SAME

CROSS-REFERENCE TO RELATED APPLICATIONS

This application is a continuation application of, and claims priority to, U.S. application Ser. No. 16/153,153, filed Oct. 5, 2018, which claims priority under 35 U.S.C. § 119 to Korean Patent Application Nos. 10-2017-0136613, filed on Oct. 20, 2017, and 10-2018-0055045, filed on May 14, 2018, in the Korean Intellectual Property Office, the entire contents of which are incorporated herein by reference in their entireties.

BACKGROUND

The inventive concepts relate to an integrated circuit (IC), and more particularly, to an IC including a via array and a method of manufacturing the same.

With the miniaturization of semiconductor processes, a pattern included in an IC may have a reduced width and/or thickness. Thus, the influence of a voltage (IR) drop caused by the pattern may increase. To reduce an IR drop between conductive patterns formed in different conductive layers, a via array including a plurality of vias may be used. The vias included in the via array may be spaced apart from each other to comply with design rules, and a conductive pattern connected to the via may include an additional area, which may be referred to as a via overlap. Thus, vias and via overlaps, which result from a via array, may degrade routability in a layout of the IC and bring about routing congestion.

SUMMARY

The inventive concepts provide integrated circuits (ICs) including via arrays. More specifically, the inventive concepts provides via arrays configured to provide improved routability, ICs including the via arrays, and methods of manufacturing the ICs.

According to an aspect of the inventive concepts, there is provided an IC including: a first conductive layer including a first conductive pattern from among conductive patterns on first tracks extending parallel to each other in a first lateral direction, a second conductive layer including a second conductive pattern and a third conductive pattern from among conductive patterns on second tracks extending parallel to each other in a second lateral direction, a third conductive layer including a fourth conductive pattern from among conductive patterns on third tracks extending parallel to each other in the first lateral direction, a first via array including a first via and a second via, where the first via is connected to a top surface of the first conductive pattern and a bottom surface of the second conductive pattern, and where the second via is connected to the top surface of the first conductive pattern and a bottom surface of the third conductive pattern, and a second via array including a third via and a fourth via, where the third via is connected to a top surface of the second conductive pattern and a bottom surface of the fourth conductive pattern, and where the fourth via is connected to a top surface of the third conductive pattern and the bottom surface of the fourth conductive pattern. The second conductive layer further includes a fifth conductive pattern which is aligned with one of the second tracks between the second conductive pattern and the third conductive pattern, extends in the second lateral direction, and is uncoupled from the second conductive pattern and the third conductive pattern.

According to another aspect of the inventive concepts, there is provided an IC including: a first conductive layer including a first conductive pattern from among conductive patterns on first tracks extending parallel to each other in a first lateral direction and a first conductive pattern extending in the first lateral direction, a second conductive layer including a second conductive pattern and a third conductive pattern from among conductive patterns on second tracks extending parallel to each other in a second lateral direction orthogonal to the first lateral direction, and a first via array including a first via and a second via, wherein the first via is connected to a top surface of the first conductive pattern and a bottom surface of the second conductive pattern, and wherein the second via is connected to the top surface of the first conductive pattern and a bottom surface of the third conductive pattern. Each of the first conductive pattern, the first via, and the second via has a length in the second lateral direction that is greater than a length of the conductive patterns on the first tracks of the first conductive layer in the second lateral direction. A center of the first conductive pattern is aligned with one of the first tracks of the first conductive layer or aligned with a central line between two adjacent first tracks of the first conductive layer.

According to another aspect of the inventive concepts, there is provided an IC including: a first conductive layer including a first conductive pattern from among conductive patterns on first tracks extending parallel to each other in a first lateral direction, a second conductive layer including a second conductive pattern and a third conductive pattern from among conductive patterns on second tracks extending parallel to each other in a second lateral direction, a third conductive layer including a fourth conductive pattern from among conductive patterns on third tracks extending parallel to each other in the first lateral direction, a first via array including first vias, each of which is connected to a top surface of the first conductive pattern and at least one of a bottom surface of the second conductive pattern and a bottom surface of the third conductive pattern, and a second via array including second vias, each of which is connected to and at least one of a top surface of the second conductive pattern and a top surface of the third conductive pattern, and to a bottom surface of the fourth conductive pattern. The first vias of the first via array are located at intersections, in a plan view, between the first tracks and the second tracks. The second vias of the second via array are located at intersections, in the plan view, between the second tracks and the third tracks.

According to another aspect of the inventive concepts, there is provided a method of manufacturing an integrated circuit. The method includes placing and routing a plurality of standard cells based on a cell library and input data for defining the integrated circuit, wherein the placing and routing of the plurality of standard cells includes adding a via stack configured to interconnect power rails and a power mesh of the plurality of standard cells. The adding of the via stack includes arranging vias at intersections, in a plan view, between tracks of adjacent conductive layers of the integrated circuit.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
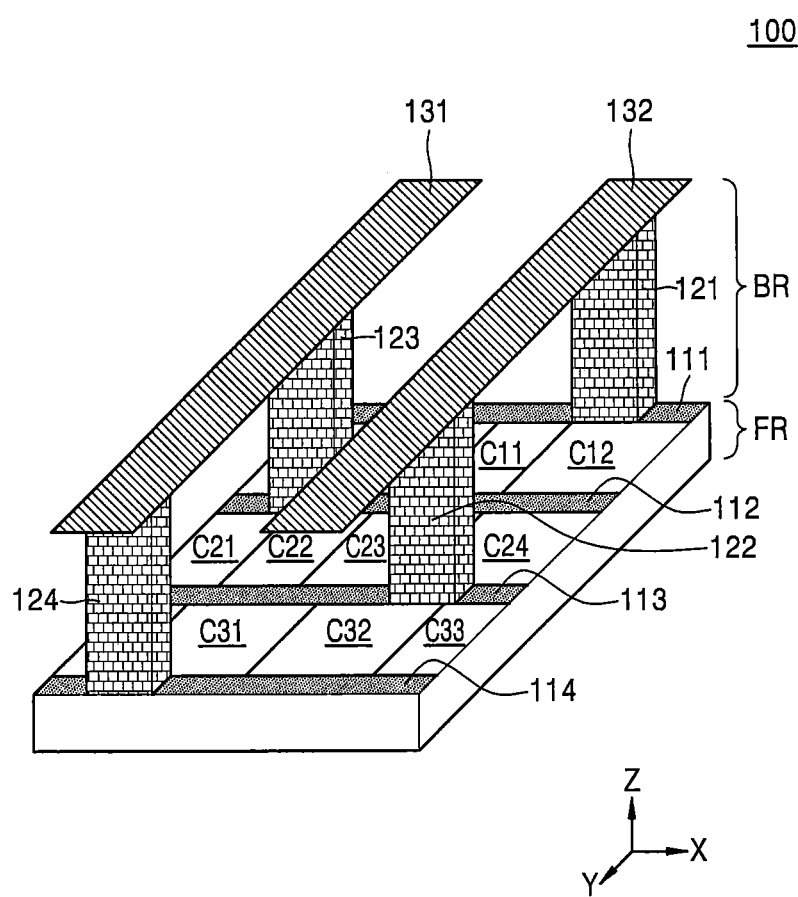
FIG. 1 is a perspective view of a portion of an integrated circuit (IC) according to an example embodiment of the inventive concepts.

FIG. 1 is a perspective view of a portion of an integrated circuit (IC) 100 according to an example embodiment of the inventive concepts. For brevity, FIG. 1 illustrates only some of layers included in the IC 100. As used herein, an X-axis direction and a Y-axis direction may be referred to as a first lateral direction and a second lateral direction, respectively, and a Z-axis direction may be referred to as a vertical direction. The first lateral direction and the second lateral direction may be orthogonal to one another. A plane formed by the X-axis and the Y-axis may be referred to as a horizontal plane. A component located in a relatively +Z (positive Z-axis) direction with respect to other components may be referred to as being over the other components. A component located in a relatively −Z (negative Z axis) direction with respect to other components may be referred to as being under the other components. In addition, from among surfaces of a component, a surface of the component in a +Z-axis direction may be referred to as a top surface of the component, and a surface of the component in a −Z-axis direction may be referred to as a bottom surface of the component. An area of a component may refer to an area of the component in a surface parallel to the horizontal plane.

Referring to FIG. 1, the IC 100 may include a Front End Of Line (FEOL) region FR and a Back End Of Line (BEOL) region BR. The FEOL region FR may include standard cells aligned in a plurality of rows. For example, as shown in FIG. 1, the FEOL region FR may include a first row of standard cells C11 and C12, a second row of standard cells C21 to C24, and a third row of standard cells C31 to C33. The number of standard cells illustrated in respective ones of the first, second, and third rows of standard cells in FIG. 1 are only for illustration purposes, and the inventive concepts are not limited thereto. A standard cell may be a unit of a layout included in the IC 100 and may be configured to observe a predetermined standard (e.g., to follow a predetermined design rule), and the IC 100 may include a plurality of various standard cells. For example, as shown in FIG. 1, standard cells (e.g., C11, C21, and C31) may have a predetermined height, that is, a length in the Y-axis direction, and power rails 111, 112, 113, 114 may be spaced apart from each other in a Y-axis direction at interfaces between the rows of standard cells (e.g., the respective rows containing standard cells C11, C21, and C31) and extend parallel to each other in an X-axis direction. In some embodiments, the standard cells (e.g., C11, C21, and C31) may include conductive patterns formed in some conductive layers of the BEOL region BR and vias connected to the conductive patterns.

The power rails 111 to 114 may supply a power supply voltage to the standard cells (e.g., C11, C21, and C31). For example, a positive supply voltage (e.g., VDD) may be applied to each of the first power rail 111 and the third power rail 113, and a negative supply voltage (e.g., VSS or a ground voltage) may be applied to each of the second power rail 112 and the fourth power rail 114. That is, a power rail may supply a power supply voltage to a source of a transistor included in a standard cell. The terms "positive" and "negative" supply voltage (e.g., VDD, VSS, or the ground voltage) are not intended to limit the value of a voltage supplied to the respective supply voltages. For example, in some embodiments, the "negative" supply voltage may be a ground voltage. The positive supply voltage and the negative supply voltage may be provided to the power rails 111 to 114 through power lines 131 and 132 and via stacks 121, 122, 123, 124, which are formed in the BEOL region BR. In some embodiments, the power lines 131 and 132 may have a greater width than conductive patterns located thereunder, that is, a greater length than the conductive patterns in an X-axis direction, and be referred to as a power mesh.

The BEOL region BR may include the power lines 131 and 132 and a plurality of conductive layers, which may include a conductive material (e.g., a metal) among the power rails 111 to 114. The via stacks 121 to 124 may be used to reduce voltage (IR) drops between the power lines 131 and 132 and the power rails 111 to 114. For example, as described below with reference to FIGS. 2A to 2C, the via stacks 121 to 124 may include a plurality of vias connected to patterns of adjacent conductive layers. Thus, a plurality of vias arranged at the same level and connected to the same node may be referred to as a via array. The via stacks 121 to 124 may include a plurality of via arrays at a plurality of levels. Thus, an IR drop between the power mesh (i.e., the power lines 131 and 132) and the power rails 111 to 114 may be reduced.

As described above, the reduced IR drop may be provided due to the via stacks 121 to 124, while the via stacks 121 to 124 may cause routing congestion in the IC 100. For example, each of the via stacks 121 to 124 may include a via array including a plurality of vias at the same level, and a conductive pattern connected to each of the vias included in the via array may include a via overlap. Thus, as described below with reference to FIGS. 2A to 2C, the via array may limit a space that may be formed by conductive patterns for routing in the conductive layers included in the BEOL region BR.

As described below with reference to the accompanying drawings, in some embodiments, a via array included in a via stack may include vias arranged at intersections between tracks of adjacent conductive layers. Thus, routability may be enhanced in the IC 100. For example, at least one conductive pattern, which is connected to a node different from the via stack, uncoupled from the via stack, and formed through the via stack, may be formed. Interconnections may be optimized due to improved routability without damaging a structure of the via stack configured to reduce the IR drop. As a result, performance of the IC 100 may be enhanced, and an area of the IC 100 may be reduced.

Figure 2A:
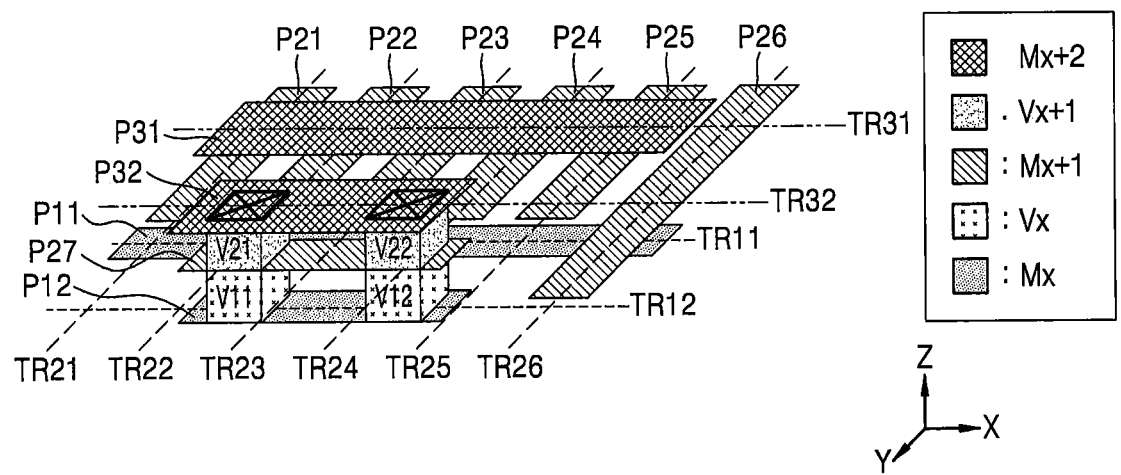
FIGS. 2A to 2C are diagrams of examples of a via stack.
Figure 2B:
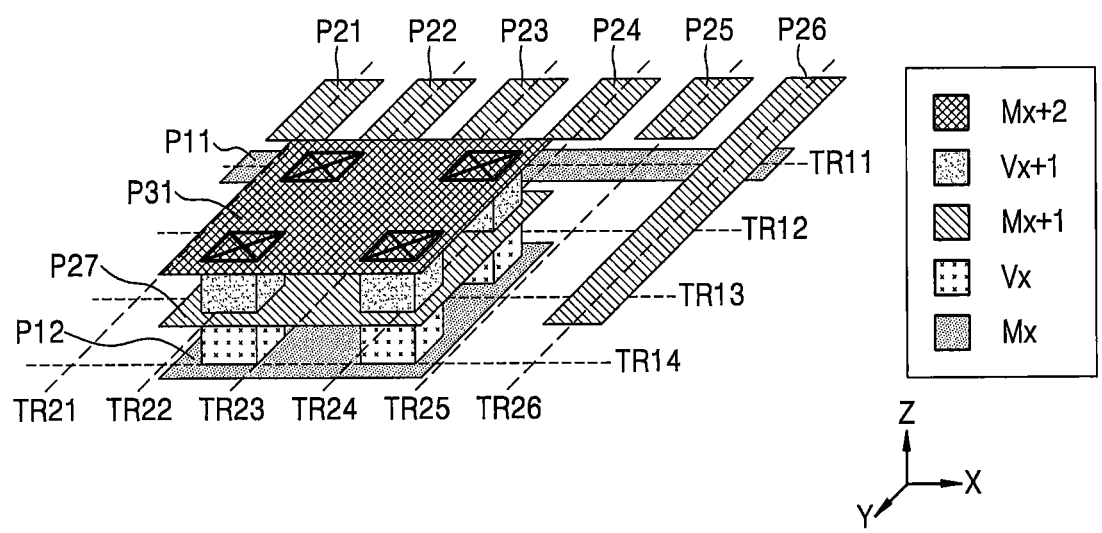
Figure 2C:
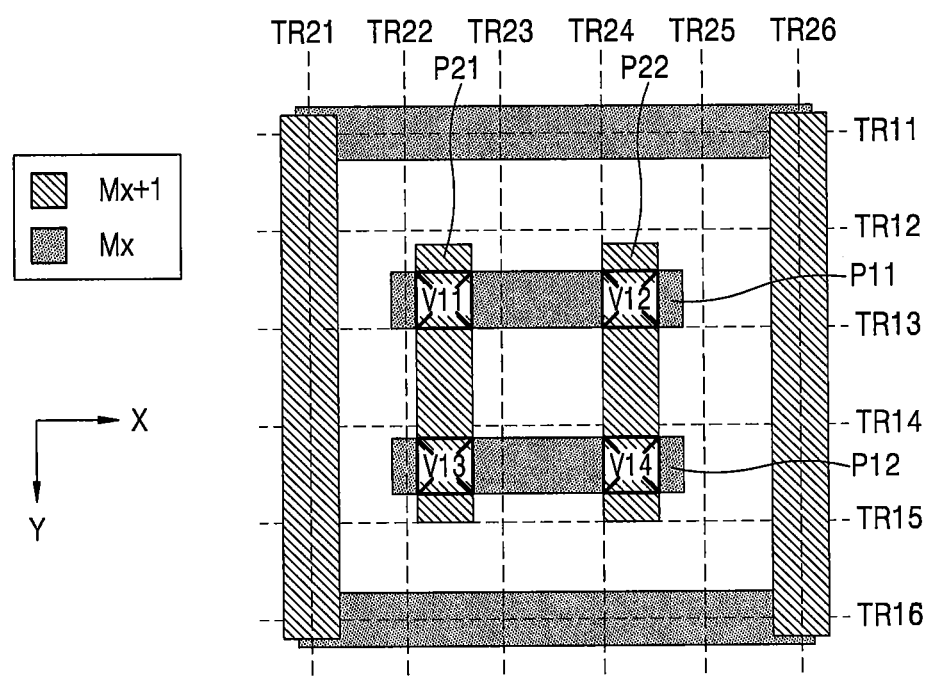

FIGS. 2A to 2C are diagrams of examples of a via stack. Specifically, FIG. 2A is a perspective view of a via stack including a 1×2 via array, FIG. 2B is a perspective view of a via stack including a 2×2 via array, and FIG. 2C is a plan view of a via stack including a 2×2 via array. Hereinafter, redundancy of descriptions of FIGS. 2A to 2C will be omitted. Although example embodiments will be described herein with reference to a 1×2 via array and a 2×2 via array, it should be understood that the inventive concepts may be applied to a 1-dimensional via array larger than a 1×2 via array and a 2-dimensional via array larger than a 2×2 via array.

Referring to FIG. 2A, conductive layers may have preferred directions for routing. For example, as shown in FIG. 2A, an Mx layer may have tracks TR11 and TR12, which may extend parallel to each other in an X-axis direction. Conductive patterns of the Mx layer may be aligned with the tracks TR11 and TR12 and extend in the X-axis direction, as illustrated by example conductive pattern P11 of the Mx layer. Similarly, an Mx+1 layer may have tracks TR21 to TR26, which may extend parallel to each other in a Y-axis direction. Conductive patterns of the Mx+1 layer may be aligned with the tracks TR21 to TR26 and extend in the Y-axis direction, as illustrated by example conductive patterns P21 to P26 of the Mx+1 layer. In addition, an Mx+2 layer may have tracks TR31 and TR32, which may extend parallel to each other in the X-axis direction. Conductive patterns of the Mx+2 layer may be aligned with the tracks TR31 and TR32 and extend in the X-axis direction, as illustrated by example conductive pattern P31 of the Mx+2 layer. Herein, it is assumed that each of the Mx layer and the Mx+2 layer has tracks extending in the X-axis direction, and the Mx+1 layer has tracks extending in the Y-axis direction. In some examples, the Mx+1 layer may be above (e.g., separated in the positive Z-axis direction) the Mx layer, and the Mx+2 layer may be above the Mx+1 layer. Also, the alignment of a conductive pattern with a track or the arrangement of the conductive pattern along the track may refer to arranging the conductive pattern such that the track passes through a center of the conductive pattern as shown in FIG. 2A. In some examples, the conductive pattern may be arranged such that the track passes through a portion of the conductive pattern that is not the center of the conductive pattern. In some embodiments, the track may be a path (e.g., an element of an alignment grid) over which a conductive pattern is arranged.

A pitch between tracks in a conductive layer may be determined according to design rules. For example, the tracks TR21 to TR26 of the Mx+1 layer may be spaced apart from each other at regular intervals according to pitch and extend in the Y-axis direction, and the pitch may be determined according to a width of conductive patterns and a minimum distance between respective ones of the conductive patterns in the Mx+1 layer. Also, as shown in FIG. 2A, a width (i.e., a Y-axis length) of conductive patterns and a pitch between tracks in the Mx+2 layer may be different from those in the Mx layer and the Mx+1 layer. To improve routability, adjacent conductive layers may have tracks in different directions. For example, as shown in FIG. 2A, the Mx layer and the Mx+2 layer may have directions parallel to the X-axis direction, while the Mx+1 layer may have a direction parallel to the Y-axis direction.

As shown in FIG. 2A, the via stack may include the 1×2 via array. For example, in the 1×2 via array between the Mx layer and the Mx+1 layer, vias V11 and V12 connected to a top surface of a conductive pattern P12 of the Mx layer and a bottom surface of a conductive pattern P27 of the Mx+1 layer may be spaced apart from each other in the X-axis direction. In some examples, the vias V11 and V12 may be at a level Vx in the via stack. In the 1×2 via array between the Mx+1 layer and the Mx+2 layer, vias V21 and V22 connected to a top surface of the conductive pattern P27 of the Mx+1 layer and a bottom surface of the conductive pattern P32 of the Mx+2 layer may also be spaced apart from each other in the X-axis direction. In some examples, the vias V21 and V22 may be at a level Vx+1 in the via stack that is higher (e.g., separated in positive Z-axis direction) than the level Vx.

In the example of FIG. 2A, vias may be arranged irrespective of tracks of conductive layers. For example, the vias may be arranged at intervals of a minimum distance between the vias, which may be defined according to design rules in the via array. Also, the conductive patterns P12, P27, and P32 of the via stack may include a via overlap. For example, as shown in FIG. 2A, the conductive patterns P12, P27, and P32 may extend more than (e.g., beyond) the interfaces among the vias V11, V12, V21, and V22 in the X-axis direction, and the more extended portions may be referred to as the via overlap. For example, the conductive pattern P12 of the Mx layer may extend in the X-axis direction along the track TR12 in a similar direction (e.g., an X-axis direction) of the Mx layer in which other conductive patterns (e.g., conductive pattern P11) of the Mx layer extend, while the conductive pattern P27 of the Mx+1 layer may extend in the X-axis direction, which may be different from a direction (e.g., a Y-axis direction) of the Mx+1 layer in which other conductive patterns (e.g., conductive patterns P21 to P26) of the Mx+1 layer extend. Thus, the extension of the conductive patterns P21 to P25 of the Mx+1 layer in the Y-axis direction may be limited due to the conductive pattern P27. That is, five tracks P21 to P25 may be sacrificed (e.g., reduced in size) by the conductive pattern P27.

Referring to FIG. 2B, the via stack may include a 2×2 via array. For example, in the 2×2 via array between an Mx layer and an Mx+1 layer, four vias connected to a top surface of a conductive pattern P12 of the Mx layer and a bottom surface of a conductive pattern P27 of the Mx+1 layer may be spaced apart from each other in an X-axis direction and a Y-axis direction. In a 2×2 via array between an Mx+1 layer and an Mx+2 layer, four vias connected to a top surface of the conductive pattern P27 of the Mx+1 layer and a bottom surface of a conductive pattern P31 of the Mx+2 layer may also be spaced apart from each other in the X-axis direction and the Y-axis direction. In the example of FIG. 2B, the vias of the 2×2 via array may be arranged irrespective of tracks of conductive layers. For example, the vias of the 2×2 via array may be arranged at intervals of a minimum distance between the vias, which is designed according to design rules.

Conductive patterns connected to the 2×2 via array may be integrally formed. For example, as shown in FIG. 2B, the conductive pattern P12 of the Mx layer, the conductive pattern P27 of the Mx+1 layer, and the conductive pattern P31 of the Mx+2 layer may have greater widths than conductive patterns, which may extend along tracks of each conductive layer (e.g., conductive patterns P21 to P26 and/or conductive pattern P11). Similarly to the example of FIG. 2A, due to the conductive pattern P27 of the Mx+1 layer, the extension of the conductive patterns P21 to P25 of the Mx+1 layer in the Y-axis direction may be limited, and five tracks P21 to P25 may be sacrificed (e.g., reduced in size).

In examples such as those illustrated in FIG. 2B, a minimum distance between a conductive pattern having a relatively large width and conductive patterns adjacent thereto in the same conductive layer may be defined as a relatively large value according to design rules. Thus, as shown in FIG. 2B, due to the conductive pattern P12, not only two tracks TR13 and TR14 intersecting the conductive pattern P12, but also the track TR12 that does not intersect the conductive pattern P12 may be sacrificed (e.g., not used in certain ones of the conductive patterns) in the Mx layer.

Referring to FIG. 2C, the via stack may include a 2×2 via array, and vias included in the 2×2 via array may be connected to different conductive patterns. For example, as shown in FIG. 2C, from among the vias of the 2×2 via array, the first via V11 and the second via V12 may be connected to a top surface of a conductive pattern P11 of an Mx layer and respectively connected to bottom surfaces of conductive patterns P21 and P22 of an Mx+1 layer. Similarly, from the vias of the 2×2 via array, a third via V13 and a fourth via V14 may be connected to a top surface of a conductive pattern P12 of the Mx layer and respectively connected to the bottom surfaces of the conductive patterns P21 and P22 of the Mx+1 layer. The conductive patterns P21 and P22 are not otherwise directly coupled to one another.

As compared with the example of FIG. 2B, in the example of FIG. 2C, the first to fourth vias V11 to V14 of the 2×2 via array may not be connected to an integrated conductive pattern so that a minimum distance between the conductive patterns P11, P12, P21, and P22 included in the via stack and peripheral conductive patterns may be reduced. However, the vias V11 to V14 may be arranged irrespective of the tracks TR11 to TR16 of the Mx layer and the tracks TR21 to TR26 of the Mx+1 layer. Thus, not only external tracks (e.g., TR12, TR15, TR22, and TR25) of the via array (e.g., tracks outside a periphery of the via array), but also internal tracks (TR23, TR24, TR13, and TR14) of the via array (e.g., tracks within the periphery of the via array), may be sacrificed.

Figure 3A:
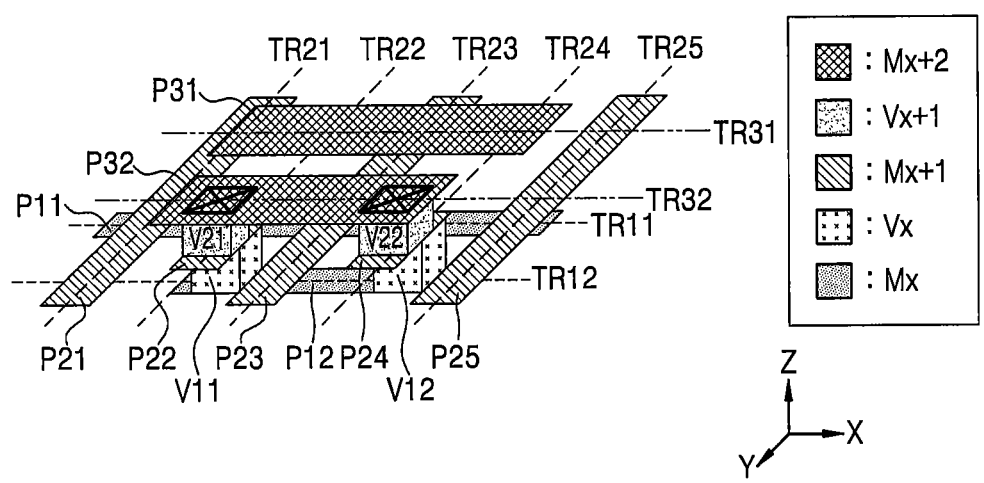
FIGS. 3A to 3C are diagrams of examples of a via stack according to example embodiments of the inventive concepts.
Figure 3B:
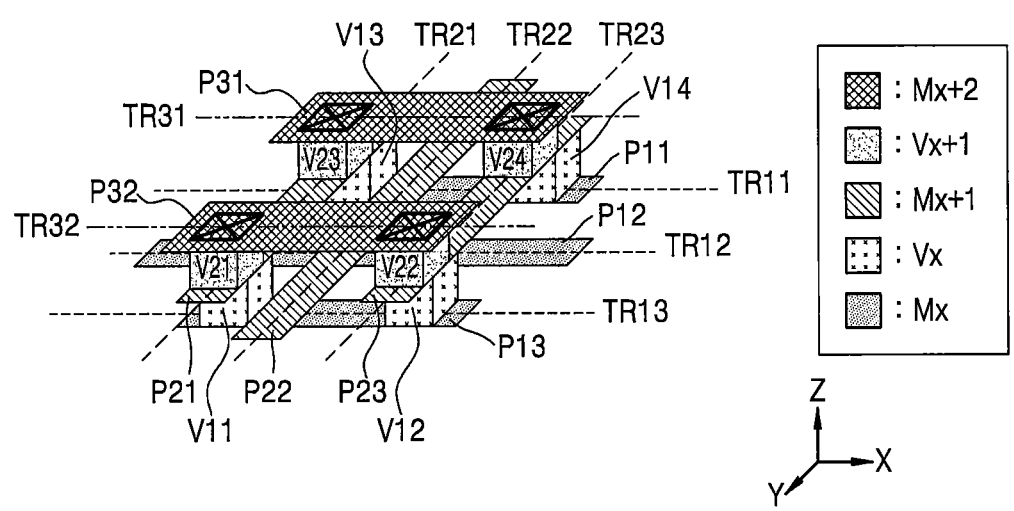
Figure 3C:
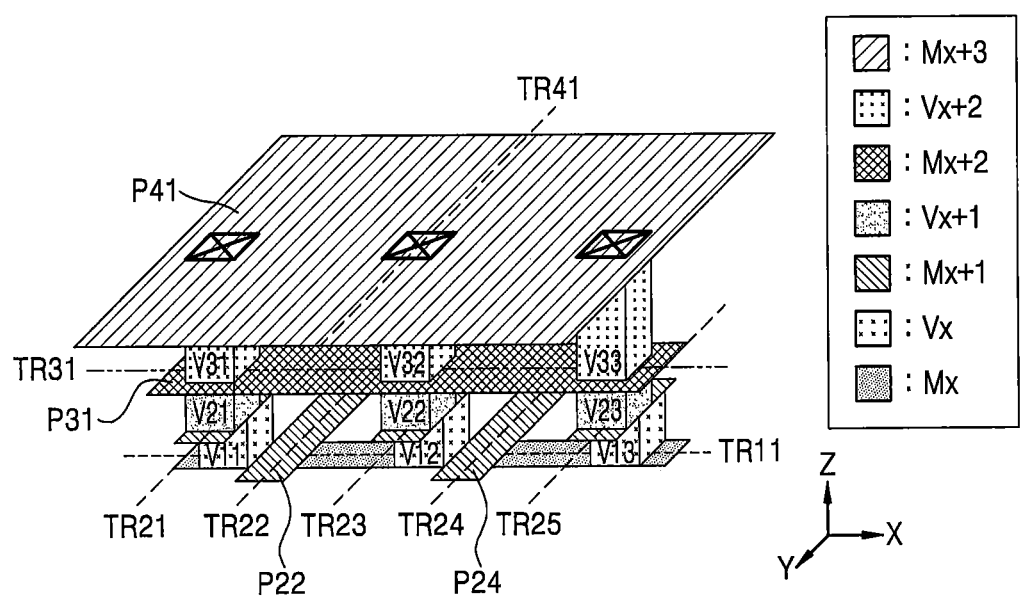

FIGS. 3A to 3C are diagrams of examples of a via stack according to example embodiments of the inventive concepts. Specifically, FIG. 3A is a perspective view of a via stack including a 1×2 via array, FIG. 3B is a perspective view of a via stack including a 2×2 via array, and FIG. 3C is a perspective view of a via stack including a 1×3 via array. Hereinafter, the same descriptions as with reference to FIGS. 2A to 2C will be omitted in descriptions of FIGS. 3A to 3C.

Referring to FIGS. 3A to 3C, in some embodiments, vias of the via array may be arranged at intersections (e.g., in a plan view) between tracks of adjacent conductive layers. As used herein, an intersection between two tracks of adjacent conductive layers refers to a region between two adjacent conductive layers that is arranged along a line that is orthogonal to the adjacent conductive layers and intersects both tracks (e.g., the two tracks vertically overlap one another). Stated another way, a via that is arranged at an intersection between tracks of two adjacent conductive layers will have one portion that intersects a first track of the two tracks in the first conductive layer and a second portion that intersects a second track of the two tracks in the second conductive layer that is adjacent the first conductive layer.

Also, conductive patterns connected to the vias of the via array may extend along tracks of conductive layers of the conductive patterns. Thus, the number of tracks that are sacrificed (i.e., the number of tracks of which use is restricted) due to the via stack may be reduced. As a result, routing congestion may be reduced to improve routability.

Referring to FIG. 3A, the via stack may include a 1×2 via array, and vias included in the 1×2 via array may be arranged at intersections between tracks. For example, in a 1×2 via array between an Mx layer and an Mx+1 layer, a via V11 connected to a top surface of a conductive pattern P12 of the Mx layer and a bottom surface of a conductive pattern P22 of the Mx+1 layer may be arranged at an intersection between a track TR12 of the Mx layer and a track TR22 of the Mx+1 layer, and a via V12 connected to the top surface of the conductive pattern P12 of the Mx layer and a bottom surface of a conductive pattern P24 of the Mx+1 layer may be arranged at an intersection between the track TR12 of the Mx layer and a track TR24 of the Mx+1 layer. Similarly, in a 1×2 via array between the Mx+1 layer and an Mx+2 layer, a via V21 connected to a top surface of the conductive pattern P22 of the Mx+1 layer and a bottom surface of a conductive pattern P32 of the Mx+2 layer may be arranged at an intersection between the track TR22 of the Mx+1 layer and a track TR32 of the Mx+2 layer, and a via V22 connected to a top surface of the conductive pattern P24 of the Mx+1 layer and the bottom surface of the conductive pattern P32 of the Mx+2 layer may be arranged at an intersection between the track TR24 of the Mx+1 layer and the track TR32 of the Mx+2 layer. In the example of FIG. 3A, a pitch between the tracks of the Mx layer may be different from a pitch between the tracks of the Mx+2 layer. Thus, as shown in FIG. 3A, the vias V11 and V12 under the Mx+1 layer may not be aligned with the vias V21 and V22 on the Mx+1 layer in a Z-axis direction.

In the via stack, the conductive patterns P12, P22, P24, and P32 may extend along the tracks of the conductive layer and provide via overlaps. For example, as shown in FIG. 3A, the conductive pattern P12 of the Mx layer may extend along the track TR12 in an X-axis direction to provide via overlaps of the vias V11 and V12, and the conductive patterns P22 and P24 of the Mx+1 layer may extend along the tracks TR22 and TR24 in a Y-axis direction to provide via overlaps of the vias V11, V12, V21, and V22.

As described above, the vias of the via array may be arranged at intersections between the tracks (e.g., of adjacent layers) and the via overlaps may extend along the tracks so that a number of usable tracks may increase. For example, as shown in FIG. 3A, although the use of the tracks TR22 and TR24 of the conductive patterns P22 and P24 configured to provide the via overlaps in the Mx+1 layer is limited, the conductive patterns P21, P23, and P25 may extend along other tracks TR21, TR23, and TR25 in the Y-axis direction. For example, the conductive pattern P23 of the Mx+1 layer may be uncoupled from the conductive patterns P22 and P24, which provide via overlaps, and may penetrate the via stack and extend along the track TR23 in the Y-axis direction. As a result, as compared with the example of FIG. 2A in which portions of the five tracks TR21 to TR25 of the Mx+1 layer are sacrificed, in the example of FIG. 3A, the number of tracks sacrificed may be reduced (e.g., having a usable length reduced), and good routability may be obtained.

In some embodiments, as illustrated in FIG. 3A, the conductive patterns of the Mx layer that are part of the via array (e.g., conductive pattern P12) may extend in the X-axis direction along the track TR12 in a similar direction (e.g., an X-axis direction) of the Mx layer in which other conductive patterns (e.g., conductive pattern P11) of the Mx layer extend, and the conductive patterns of the Mx+1 layer that are part of the via array (e.g., conductive pattern P22) may extend in the Y-axis direction, which may be similar to a direction (e.g., the Y-axis direction) of the Mx+1 layer in which other conductive patterns (e.g., conductive patterns P21, P23, and P25) of the Mx+1 layer extend.

Referring to FIG. 3B, the via stack may include a 2×2 via array, and vias included in the 2×2 via array may be arranged at intersections between tracks. For example, in the 2×2 via array between an Mx layer and an Mx+1 layer, vias V11 and V12 connected to a top surface of a conductive pattern P13 of the Mx layer may be respectively arranged at intersections between a track TR13 of the Mx layer and tracks TR21 and TR23 of the Mx+1 layer, and vias V13 and V14 connected to a top surface of a conductive pattern P11 of the Mx layer may be respectively arranged at intersections between a track TR11 of the Mx layer and tracks TR21 and TR23 of the Mx+1 layer. Also, in the 2×2 via array between the Mx+1 layer and an Mx+2 layer, vias V21 and V23 connected to a top surface of a conductive pattern P21 of the Mx+1 layer may be respectively arranged at intersections between the track TR21 of the Mx+1 layer and tracks TR32 and TR31 of the Mx+2 layer, and vias V22 and V24 connected to a top surface of a conductive pattern P23 of the Mx+1 layer may be respectively arranged at intersections between the track TR23 of the Mx+1 layer and the tracks TR32 and TR31 of the Mx+2 layer.

As shown in FIG. 3B, conductive patterns P11, P13, P21, P23, P31, and P32 of the via stack may extend along tracks of a conductive layer and provide via overlaps. For example, the conductive patterns P11 and P13 of the Mx layer may extend along the tracks TR11 and TR13 to provide vias overlaps of the vias V11 to V14. Also, the conductive patterns P21 and P23 of the Mx+1 layer may extend along the tracks TR21 and TR23 in a Y-axis direction to provide via overlaps of the vias V11 to V14 and V21 to V24.

As shown in FIG. 3B, since the tracks TR11 and TR13 of the conductive patterns P11 and P13 that provide the via overlaps are sacrificed in the Mx layer, a conductive pattern (e.g., P12) may extend along other tracks (e.g., TR12) of the Mx layer in an X-axis direction. Similarly, since the tracks TR21 and TR23 of the conductive patterns P21 and P23 that provide the via overlaps are sacrificed in the Mx+1 layer, a conductive pattern (e.g., P22) may extend along other tracks (e.g., TR22) of the Mx+1 layer in a Y-axis direction. As a result, as compared with the example of FIG. 2B in which portions of five tracks TR21 to TR25 of the Mx+1 layer may be sacrificed and the example of FIG. 2C in which portions of four tracks TR22 to TR25 of the Mx+1 layer may be sacrificed, in the example of FIG. 3B, the number of tracks sacrificed (e.g., having a usable length reduced) may be reduced, and good routability may be obtained.

Referring to FIG. 3C, the via stack may be connected to a conductive pattern P41 having a large width (e.g., a width larger than conductive patterns, such as P22 and P24, in other layers). As shown in FIG. 3C, the conductive pattern P41 may extend along a track TR41 in a Y-axis direction in an Mx+3 layer, and be referred to as a fat metal. In some embodiments, the conductive pattern P41 may be a power line (e.g., 131 and 132 of FIG. 1) included in a power mesh. Although the track TR41 of the Mx+3 layer extends in the Y-axis direction, the conductive pattern P41 of the Mx+3 layer may be connected to a conductive pattern P31 of an Mx+2 layer through vias V31 to V33 (i.e., a 1×3 via array) arranged in the X-axis direction due to a width (i.e., a larger length of the conductive pattern P41 in the X-axis) of the conductive pattern P41, and 1×3 via arrays may be repeated under the Mx+2 layer. For example, a 1×3 via array including three vias V21 to V23 may be between the Mx+2 layer and an Mx+1 layer, and a 1×3 via array including three vias V11 to V13 may be between the Mx+1 layer and the Mx layer.

As shown in FIG. 3C, vias of the 1×3 via array may be arranged at intersections between tracks so that usable tracks may increase. For example, between conductive patterns that provide via overlaps along tracks TR21, TR23, and TR25 in the Mx+1 layer, conductive patterns P22 and P24 uncoupled from the via stack may penetrate the via stack and extend in the Y-axis direction along tracks TR22 and TR24. Although the 1×3 via array is illustrated in FIG. 3C, the via stack may include a 1-dimensional via array of 1×4 or more in some embodiments or a 2-dimensional via array of 2×3 or more in some embodiments.

Figure 4:
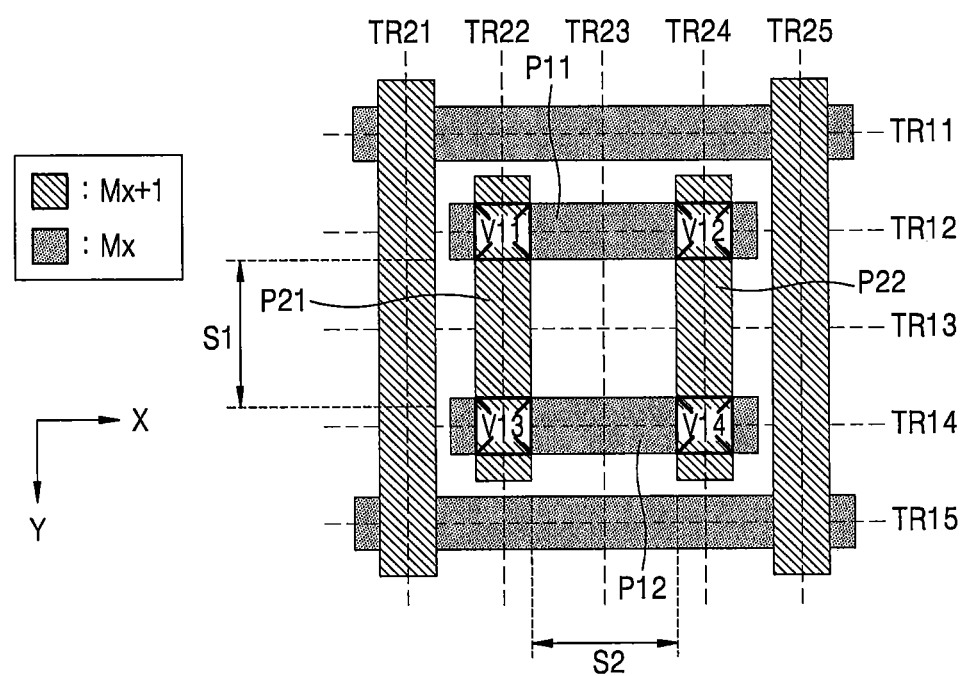
FIG. 4 is a plan view of an example of a via stack according to an example embodiment of the inventive concepts.

FIG. 4 is a plan view of an example of a via stack according to an example embodiment of the inventive concepts. Specifically, FIG. 4 illustrates an example of a via stack including a 2×2 via array between an Mx layer and an Mx+1 layer. In FIG. 4, shading is used to indicate conductive patterns that are on different layers (e.g., Mx layer vs. Mx+1 layer) separated in a Z-axis direction.

As shown in FIG. 4, vias V11 to V14 of a 2×2 via array may be respectively arranged at intersections between tracks TR12 and TR14 of an Mx layer and tracks TR22 and TR24 of an Mx+1 layer. A first via V11 and a second via V12 may be connected to a top surface of a conductive pattern P11 of the Mx layer and respectively connected to bottom surfaces of conductive patterns P21 and P22 of the Mx+1 layer. Also, a third via V13 and a fourth via V14 may be connected to a top surface of a conductive pattern P12 of the Mx layer and respectively connected to the bottom surfaces of the conductive patterns P21 and P22 of the Mx+1 layer. In some embodiments, a distance S2 by which the vias V11 and V13 of the 2×2 via array are respectively spaced apart from the vias V12 and V14 in the X-axis direction and a distance S1 by which the vias V13 and V14 of the 2×2 via array are respectively spaced apart from the vias V11 and V12 in the Y-axis direction may be greater than a minimum distance between vias, which is defined according to design rules. Thus, the vias V11 to V14 of the 2×2 via array may observe design rules. Although not shown in FIG. 4, a conductive pattern insulated from the via stack may extend along a track TR13 of the Mx layer in an X-axis direction, and a conductive pattern insulated from the via stack may extend along a track TR23 of the Mx+1 layer in a Y-axis direction.

When the vias are arranged at intersections between the tracks, the distance S1 by which the vias are spaced apart from each other in the Y-axis direction may be calculated as in Equation 1:

$$S1 = n \times \{Mx \text{ track pitch}\} - \{\text{via length}\} \tag{1},$$

where n may denote a positive integer. When a minimum distance between vias, which is defined according to design rules, is greater than a pitch between tracks of the Mx layer, n may be an integer equal to or more than 2. In Equation 1, {Mx track pitch} may refer to a pitch between the tracks (e.g., tracks TR11 to TR15) of the Mx layer of FIG. 4 and denote a pitch between tracks in a conductive layer having tracks parallel to an X-axis from among conductive layers connected to vias of an arbitrary via array. In Equation 1, {via length} may refer to a length of the vias (e.g., vias V11 to V14) in the Y-axis direction. That is, a pitch between vias in the Y-axis direction in the via array may be a multiple of the pitch between the tracks of the Mx layer.

Similarly, the distance S2 by which the vias are spaced apart from each other in the X-axis direction may be calculated as in Equation 2:

$$S2 = m \times \{Mx+1 \text{ track pitch}\} - \{\text{via width}\} \quad (2),$$

where m may be a positive integer. When a minimum distance between vias, which is defined according to design rules, is greater than a pitch between the tracks of the Mx+1 layer, m may be an integer equal to or more than 2. In Equation 2, {Mx+1 track pitch} may refer to the pitch between the tracks (e.g., tracks TR21 to TR25) of the Mx+1 layer of FIG. 4, and denote a pitch between tracks in a conductive layer having tracks parallel to a Y-axis from among conductive layers connected to vias of an arbitrary via array. Also, in Equation 2, {via width} may refer to a length of the via (e.g., vias V11 to V14) in the X-axis direction. That is, a pitch between vias in the X-axis direction in the via array may be a multiple of the pitch between the tracks of the Mx+1 layer.

Figure 5:
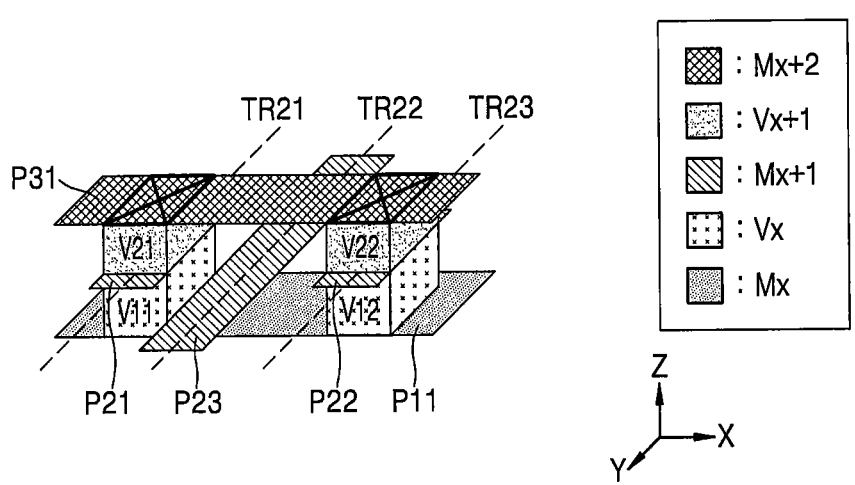
FIG. 5 is a perspective view of an example of a via stack according to an example embodiment of the inventive concepts.

FIG. 5 is a perspective view of an example of a via stack according to an example embodiment of the inventive concepts. Specifically, FIG. 5 illustrates a via array including bar-type vias and a via stack including the via array.

Referring to FIG. 5, in the via stack, the via array may include bar-type vias. A bar-type via may refer to a via having a relatively large length in an X-axis direction and/or a Y-axis direction, for example, a via having a length greater than a width of a conductive pattern (e.g., greater than a width of one or more conductive patterns in an adjacent layer). For example, as shown in FIG. 5, a 1×2 via array may include vias V11 and V12 having a large length in the Y-axis direction between an Mx layer and an Mx+1 layer, and a 1×2 via array may also include vias V21 and V22 having a large length in the Y-axis direction between the Mx+1 layer and an Mx+2 layer. As a cross-sectional area of a via, that is, an area of the via in a surface parallel to a plane formed by an X-axis and a Y-axis, increases, an IR drop caused by the via may be reduced. Thus, as shown in FIG. 5, vias having a large cross-sectional area may be used.

In some embodiments, the bar-type vias may be arranged along tracks and overlap conductive patterns extending along the track. For example, as shown in FIG. 5, the via V11 connected to a top surface of a conductive pattern P11 of the Mx layer and a bottom surface of a conductive pattern P21 of the Mx+1 layer may be aligned with a via V21 connected to a top surface of the conductive pattern P21 of the Mx+1 layer and a bottom surface of a conductive pattern P31 of the Mx+2 layer along a track TR21 of the Mx+1 layer. Similarly, the vias V12 and V22 may also be aligned with each other along a track TR23 of the Mx+1 layer. Thus, a conductive pattern P23 of the Mx+1 layer may extend along a track TR22 in the Y-axis direction.

In some embodiments, the bar-type vias may be arranged to minimize the sacrifice of the tracks. For example, the vias V11, V12, V21, and V22 may be aligned with the tracks TR21 and TR23 to minimize the sacrifice of the tracks of the Mx+1 layer, and positions of the vias V11, V12, V21, and V22 in the Y-axis direction may be determined based on lengths of the vias V11, V12, V21, and V22 in the Y-axis direction. As described below with reference to FIG. 6, the number of tracks sacrificed may be changed according to positions of bar-type vias, so that the positions of the bar-type vias may be determined to minimize the number of tracks sacrificed. Although an example of a 1×2 via array including bar-type vias is illustrated in FIG. 5, in some embodiments, the via stack may include a 1-dimensional via array of 1×3 or more, which includes bar-type vias, and in some other embodiments, the via stack may include a 2-dimensional via array of 2×2 or more, which includes bar-type vias.

Figure 6:
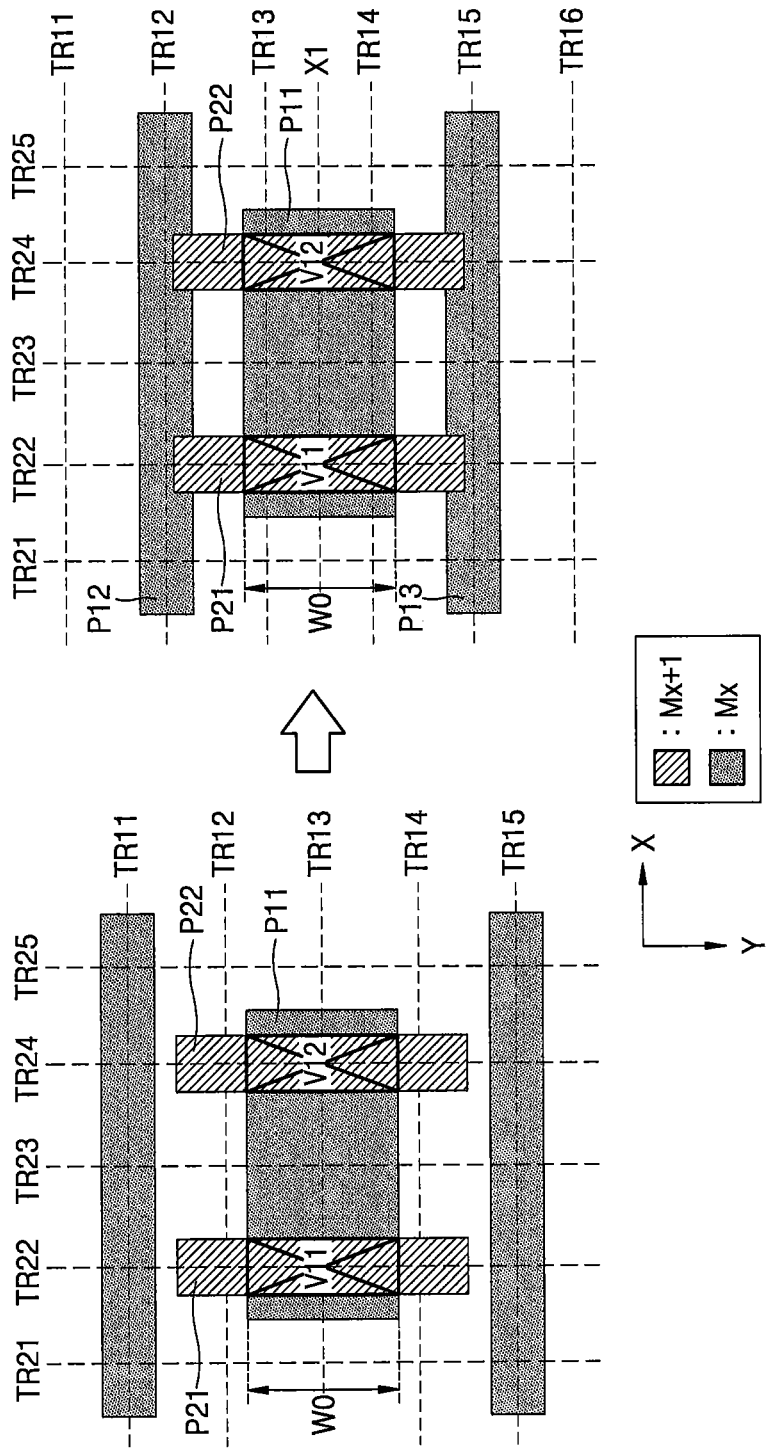
FIG. 6 is a diagram of an example of a via array according to an example embodiment of the inventive concepts.

FIG. 6 is a diagram of an example of a via array according to an example embodiment of the inventive concepts. Specifically, FIG. 6 illustrates an example in which the number of tracks sacrificed is changed according to the arrangement of the via array. As shown in FIG. 6, a 1×2 via array may include vias V11 and V12 between an Mx layer and an Mx+1 layer, and the vias V11 and V12 may be bar-type vias. The vias V11 and V12 may have a length equal to a width of conductive patterns P21 and P22 of the Mx+1 layer in an X-axis direction and have a relatively large length W0 in a Y-axis direction (e.g., greater than the width of conductive patterns P21 and P22 of the Mx+1 layer in the X-axis direction).

Referring to the left-most example of FIG. 6, the vias V11 and V12 of the 1×2 via array may be arranged along tracks TR22 and TR24 of the Mx+1 layer and arranged along a track TR13 of the Mx layer. That is, the vias V11 and V12 may be arranged such that centers of sections of the vias V11 and V12 overlap the tracks TR22 and TR24 of the Mx+1 layer and the track TR13 of the Mx layer. A conductive pattern P11 of the Mx layer may extend in the X-axis direction to provide via overlaps of the vias V11 and V12, and have a width equal to a length W0 of the vias V11 and V12 in the Y-axis direction. Also, the conductive patterns P21 and P22 of the Mx+1 layer may extend in the Y-axis direction to provide the via overlaps of the vias V11 and V12.

Two tracks TR22 and TR24 may be sacrificed in the Mx+1 layer due to the conductive patterns P21 and P22, while three tracks TR12 to TR14 may be sacrificed in the Mx layer due to the conductive pattern P11. Since the track TR13 of the Mx layer intersects the conductive pattern P11, the track TR13 of the Mx layer may be sacrificed. However, when conductive patterns are arranged to extend along the tracks TR12 and TR14 of the Mx layer in the X-axis direction, a distance between the conductive patterns and the conductive pattern P11 may violate a minimum distance defined according to design rules, so that the tracks TR12 and TR14 may be sacrificed. Thus, in the leftmost example of FIG. 6, performing a route operation using the three tracks TR12 to TR14 of tracks of the Mx layer may be limited.

Referring to a rightmost example of FIG. 6, a via stack shown in the left example of FIG. 6 may be relocated in a Y-axis direction. Thus, as shown in the rightmost example of FIG. 6, vias V11 and V12 of a 1×2 via array may be arranged along tracks TR22 and TR24 of an Mx+1 layer and also, arranged along a central line X1 between tracks TR13 and TR14 of an Mx layer. That is, the vias V11 and V12 may be arranged such that centers of sections of the vias V11 and V12 overlap the central line X1, which may extend along a center between the tracks TR13 and TR14 of the Mx layer and extend in the X-axis direction.

Two tracks TR22 and TR24 may be sacrificed in the Mx+1 layer due to the conductive patterns P21 and P22, while two tracks TR13 and TR14 may be sacrificed in the Mx layer due to the conductive pattern P11 having the length W0 in the Y-axis direction. That is, since the tracks TR13 and TR14 of the Mx layer intersect the conductive pattern P11, the tracks TR13 and TR14 of the Mx layer may be sacrificed. However, even if conductive patterns P12 and P13 are arranged to extend in the X-axis direction along tracks TR12 and TR15 of the Mx layer, since the conductive patterns P12 and P13 are spaced apart from the conductive pattern P11 by at least a minimum distance defined according to design rules, the design rules may be observed. Thus, in the rightmost example of FIG. 6, performing a route operation using the two tracks TR13 and TR14 of tracks of the Mx layer may be limited. As described above, the number of tracks sacrificed may be changed according to position of the same via array including bar-type vias. Hereinafter, examples of a via array arranged to reduce the number of tracks sacrificed will be described with reference to FIGS. 7A to 7C.

Figure 7A:
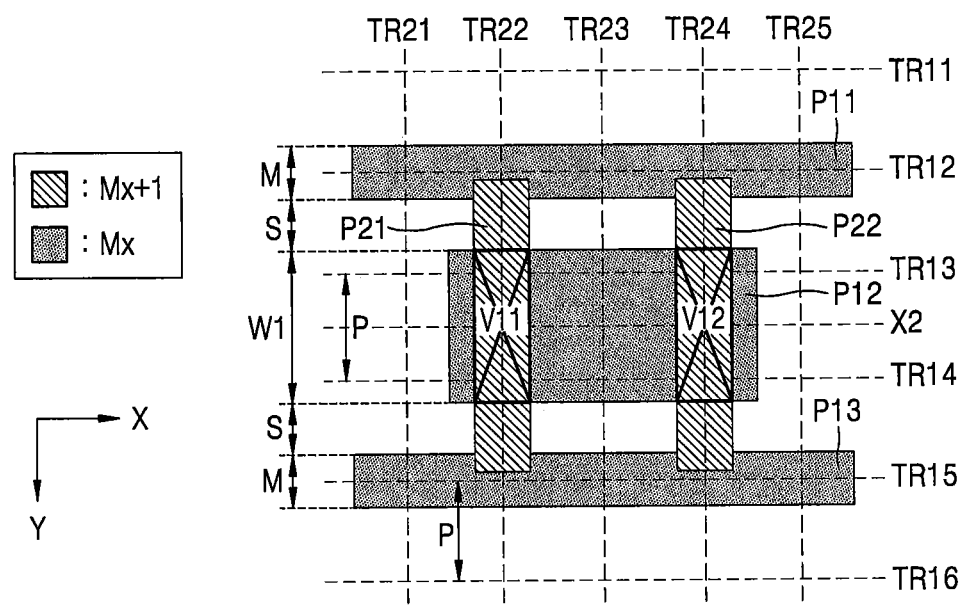
FIGS. 7A to 7C are diagrams of examples of a via array according to example embodiments of the inventive concepts.
Figure 7B:
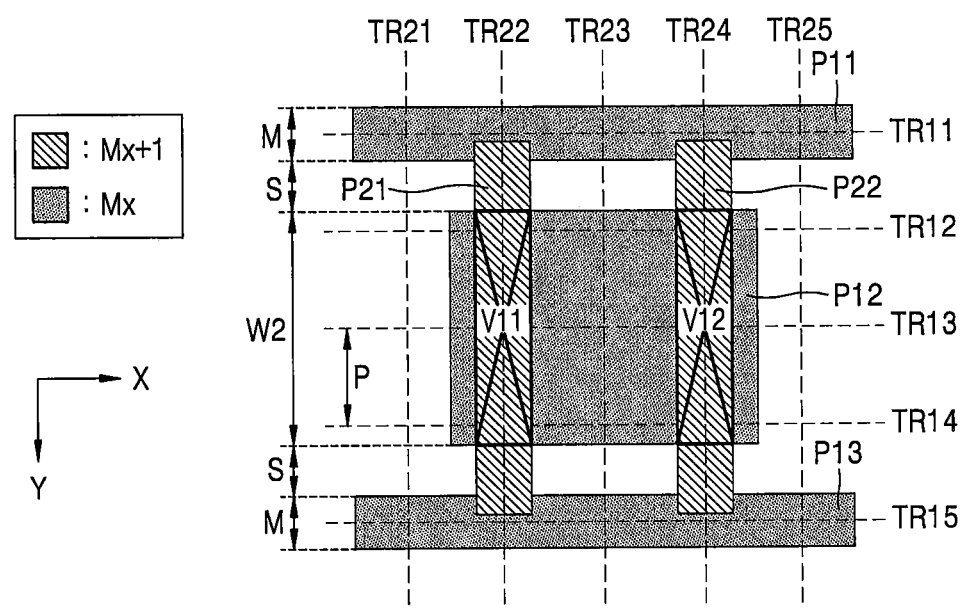
Figure 7C:
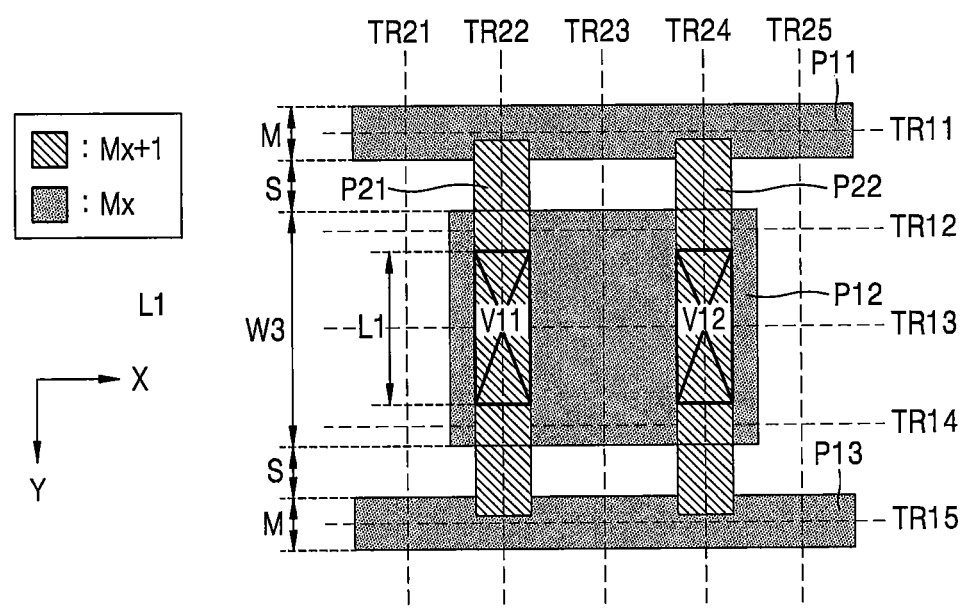

FIGS. 7A to 7C are diagrams of examples of a via array according to example embodiments of the inventive concepts. Specifically, FIG. 7A illustrates a 1×2 via array including vias V11 and V12 arranged along a central line X2 between tracks TR13 and TR14 of an Mx layer, and FIGS. 7B and 7C respectively illustrate 1×2 via arrays including vias V11 and V12 arranged along a track TR13 of the Mx layer. Hereinafter, redundancy of descriptions of FIGS. 7A to 7C will be omitted.

Referring to FIG. 7A, vias V11 and V12 may have a length W1 in a Y-axis direction. The vias V11 and V12 may be connected to a top surface of a conductive pattern P12 of an Mx layer and respectively connected to bottom surfaces of conductive patterns P21 and P22 of an Mx+1 layer. Tracks TR13 and TR14 of the Mx layer may be sacrificed due to the conductive pattern P12 having a width W1, while conductive patterns P11 and P13 may extend along tracks TR12 and TR15 in an X-axis direction.

To reduce the number of tracks of the Mx layer that are sacrificed by the via array, when a width W of a conductive pattern of the Mx layer due to the via array satisfies Equation 3, vias of the via array may be arranged along a central line between adjacent tracks.

$$2nP-M-2S<W\leq(2n+1)P-M-2S \quad (3).$$

In FIG. 7A and Equation 3, W denotes a width of a conductive pattern of an Mx layer that is connected to the via array (e.g., W1 of conductive pattern P12), M denotes a width of a conductive pattern of an Mx layer that is not connected to the via array (e.g., conductive pattern P11), P denotes a pitch between tracks of the Mx layer, S denotes a minimum distance between conductive patterns of the Mx layer, which is defined according to design rules, and n denotes a positive integer. In the via array (or conductive pattern) that satisfies Equation 3, an even number of tracks may be sacrificed in the Mx layer.

Referring to FIG. 7B, vias V11 and V12 may have a length W2 in a Y-axis direction. The vias V11 and V12 may be connected to a top surface of a conductive pattern P12 of an Mx layer and respectively connected to bottom surfaces of conductive patterns P21 and P22 of an Mx+1 layer. Tracks TR12 to TR14 of the Mx layer may be sacrificed due to the conductive pattern P12 having a width W2, while conductive patterns P11 and P13 may extend along tracks TR11 and TR15 in an X-axis direction.

To reduce the number of tracks of the Mx layer, which are sacrificed by the via array, when a width W of a conductive pattern of the Mx layer due to the via array satisfies Equation 4, vias of the via array may be arranged along a track.

$$(2n+1)P-M-2S<W\leq(2n+2)P-M-2S \quad (4),$$

In FIG. 7B and Equation 4, W may be a width of the conductive pattern of the Mx layer that is connected to the via array (e.g., W2 of conductive pattern P12), M denotes a width of a conductive pattern of an Mx layer that is not connected to the via array (e.g., conductive pattern P11), P may be a pitch between the tracks of the Mx layer, S may be a minimum distance between conductive patterns of an Mx layer defined according to design rules, and n may be a positive integer. In a via array (or a conductive pattern) that satisfies Equation 4, an odd number of tracks may be sacrificed in the Mx layer.

Referring to FIG. 7C, in some embodiments, a via may have a length less than a width of a conductive pattern. For example, as shown in FIG. 7C, a conductive pattern P12 of an Mx layer may have a width W3 in a Y-axis direction, while vias V11 and V12 may have a length L1 less than the width W3 in the Y-axis direction. The conductive pattern P12 of the Mx layer may be aligned with (e.g., centered over) a track TR13 of the Mx layer to satisfy Equation 4, while the vias V11 and V12 having a length L1 less than a width W3 of the conductive pattern P12 of the Mx layer may be respectively arranged at intersections between the track TR13 of the Mx layer and tracks TR22 and TR24 of the Mx+1 layer as shown in FIG. 7C.

Figure 8:
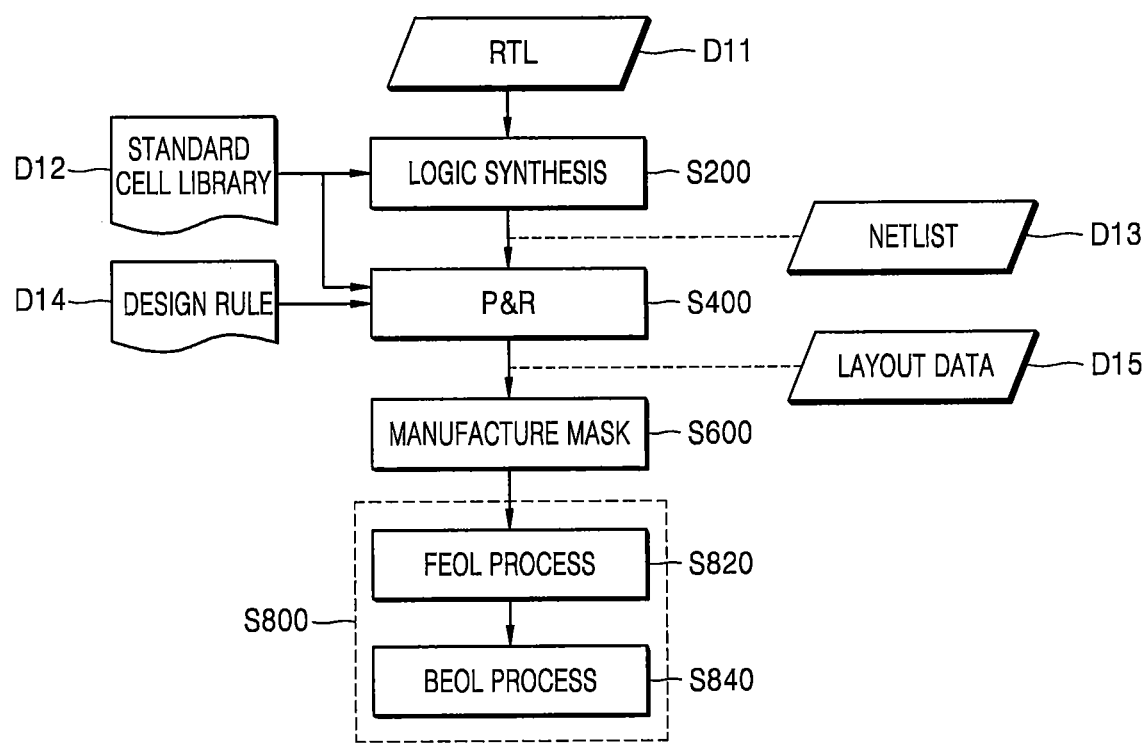
FIG. 8 is a flowchart of a method of manufacturing an IC, according to an example embodiment of the inventive concepts.

FIG. 8 is a flowchart of a method of manufacturing an IC according to an example embodiment of the inventive concepts. In some embodiments, at least some of operations S200, S400, S600, and S800 shown in FIG. 8 may be performed by a computing system (e.g., 300 of FIG. 12).

In operation S200, a logic synthesis operation of generating netlist data D13 based on RTL data D11 with reference to a standard cell library D12 may be performed. The RTL data D11 may define functions of the IC and be written in a hardware description language (HDL), such as very-high-speed integrated circuits (VHSIC) hardware description language (VHDL) and Verilog, but the inventive concepts are not limited thereto. The standard cell library D12 may define functions and properties of standard cells. A semiconductor design tool (e.g., a logic synthesis tool) may perform a logic synthesis operation based on the RTL data D11 with reference to the standard cell library D12 and generate the netlist data D13 including bitstreams and/or netlists for defining an IC, that is, defining a plurality of standard cells and connection relationships between the standard cells.

In operation S400, a place & route (P&R) operation of generating layout data D15 based on the netlist data D13 with reference to the standard cell library D12 and the design rule D14 may be performed. The standard cell library D12 may define layouts of the standard cells, and the design rule D14 may define rules observed by a layout of the IC in accordance with a semiconductor process (e.g., operation S800). For example, the design rule D14 may define a direction and pitch of tracks of a conductive layer, a minimum distance between conductive patterns in the conductive layer, a width of the conductive patterns in the conductive layer, and a minimum distance between vias at the same level.

A semiconductor design tool (e.g., a P&R tool) may arrange a plurality of standard cells with reference to the standard cell library D12 based on the netlist data D13 and route input pins, output pins, and power tabs of the plurality of standard cells arranged with reference to the design rule D14. A routing operation may include generating interconnections including vias and/or conductive patterns. Also, the semiconductor design tool may generate a plurality of via stacks to reduce an IR drop. As described above with reference to the drawings, vias of a via array included in each of the via stacks may be arranged at intersections between tracks of conductive layers (e.g., adjacent conductive layers) in some embodiments, or may be arranged along a central line between the tracks in some other embodiments.

Thus, the via stacks may provide a reduced IR drop and reduce routing congestion. An example of operation S400 will be described below with reference to FIG. 9.

In operation S600, an operation of manufacturing a mask may be performed. For example, optical proximity correction (OPC) may be applied to the layout data D15, patterns on the mask may be defined to form patterns on a plurality of layers, and at least one mask (or photomask) may be manufactured to form the patterns on each of the plurality of layers.

In operation S800, an operation of fabricating an IC may be performed. For example, a plurality of layers may be patterned using at least one mask manufactured in operation S600, thereby fabricating the IC. As shown in FIG. 8, operation S800 may include operations S820 and S840.

In operation S820, an FEOL process may be performed. The FEOL process may refer to a process of forming individual elements (e.g., transistors, capacitors, and/or resistors) on a substrate in an IC fabrication process. For example, the FEOL process may include planarizing and cleaning a wafer, forming a trench, forming a well, forming a gate line, and forming a source and a drain. Thus, elements included in a plurality of standard cells may be formed.

In operation S840, a BEOL process may be performed. The BEOL process may refer to a process of interconnecting individual elements (e.g., transistors, capacitors, and/or resistors) in an IC fabrication process. For example, the BEOL process may include siliciding gate, source, and/or drain regions, adding a dielectric material, performing a planarization process, forming a hole, adding a metal layer, forming a via, and/or forming a passivation layer. The via stack may be formed in the BEOL process (i.e., operation S840). Next, an IC may be packaged in a semiconductor package and used as a component of various applications.

Figure 9:
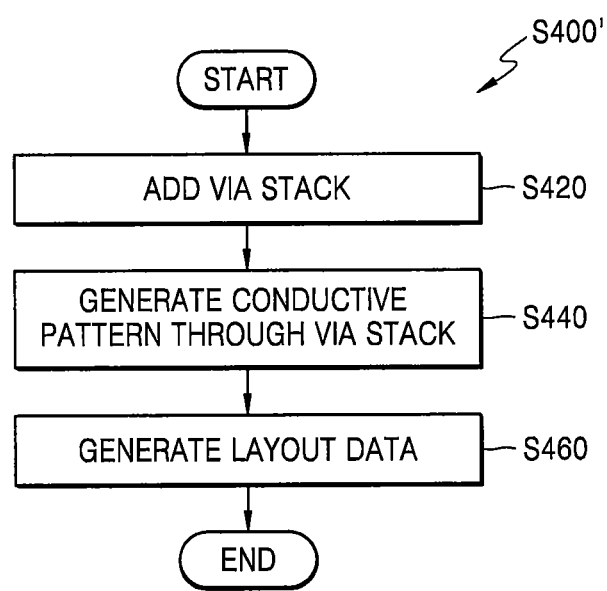
FIG. 9 is a flowchart of an example of operation S400 of FIG. 8, according to an example embodiment of the inventive concepts.

FIG. 9 is a flowchart of an example of operation S400 of FIG. 8, according to an example embodiment of the inventive concepts. As described above with reference to FIG. 8, in operation S400' of FIG. 9, a place & route (P&R) operation may be performed with reference to a standard cell library D12 and a design rule D14. As shown in FIG. 9, operation S400' may include a plurality of operations S420, S440, and S460. Hereinafter, the flowchart of FIG. 9 will be described with reference to FIG. 8.

In operation S420, an operation of adding a via stack may be performed. For example, after a plurality of standard cells are arranged, an operation of adding a via stack configured to interconnect power lines of a power mesh and power rails may be performed. In some embodiments, a via stack for a signal instead of a power supply voltage may be added. An example of operation S420 will be described below with reference to FIG. 10.

In operation S440, an operation of generating a conductive pattern through the via stack may be performed. The via stack added in operation S420 may include a via array including vias, which are arranged along tracks of a conductive layer or arranged at intersections between tracks of conductive layers. Thus, the number of tracks sacrificed by the via stack may be reduced. As described above with reference to FIGS. 3A to 3C, when a minimum distance between vias located at the same level, which is defined according to design rules, is greater than a pitch between tracks, a conductive pattern that may pass between the vias of the via array and be insulated from the via may be generated. Thus, the conductive pattern formed through the via stack may be used to route signals and/or power supply voltages.

In operation S460, an operation of generating layout data may be performed. As described above with reference to FIG. 8, layout data D15 may define a layout of an IC, may have a format, such as Graphic Data System II (GDSII), and may include geometric information about standard cells and interconnections.

Figure 10:
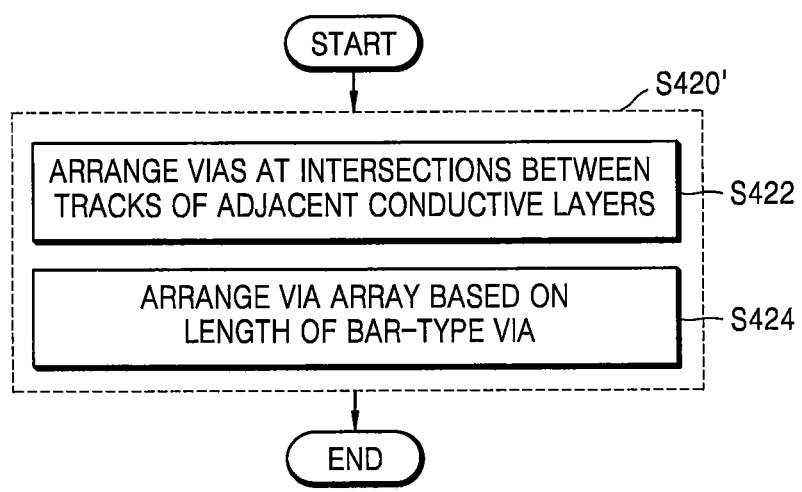
FIG. 10 is a flowchart of an example of operation S420 of FIG. 9, according to an example embodiment of the inventive concepts.

FIG. 10 is a flowchart of an example of operation S420 of FIG. 9, according to an example embodiment of the inventive concepts. As described above with reference to FIG. 9, an operation of adding a via stack may be performed in operation S420' of FIG. 10. As shown in FIG. 10, operation S420' may include operation S422 and operation S424. In some embodiments, operation S422 and operation S424 may be performed concurrently.

In operation S422, an operation of arranging vias at intersections between tracks of adjacent conductive layers may be performed. For example, as described above with reference to FIG. 4, vias (e.g., V11 to V14) of a via array may be arranged at intersections between tracks (e.g., TR12, TR14, TR22, and TR24) of adjacent conductive layers (e.g., an Mx layer and an Mx+1 layer). Thus, sacrificed tracks may be reduced, thereby increasing routable tracks.

In operation S424, an operation of arranging a via array based on a length of a bar-type via may be performed. For example, as described above with reference to FIG. 6, the number of tracks sacrificed may vary according to a position of the bar-type via. Thus, as described with reference to FIGS. 7A to 7C, the bar-type via may be arranged along a track or a central line between tracks based on the length of the bar-type via. For example, when a width W of the bar-type via in one direction satisfies Equation 3, the bar-type via may be arranged along a central line between the tracks as shown in FIG. 7A. On the other hand, when the width W of the bar-type via in one direction satisfies Equation 4, the bar-type via may be arranged along a track as shown in FIG. 7B. Thus, the number of the tracks sacrificed may be reduced due to the via array including bar-type vias, and routable tracks may be increased.

Figure 11:
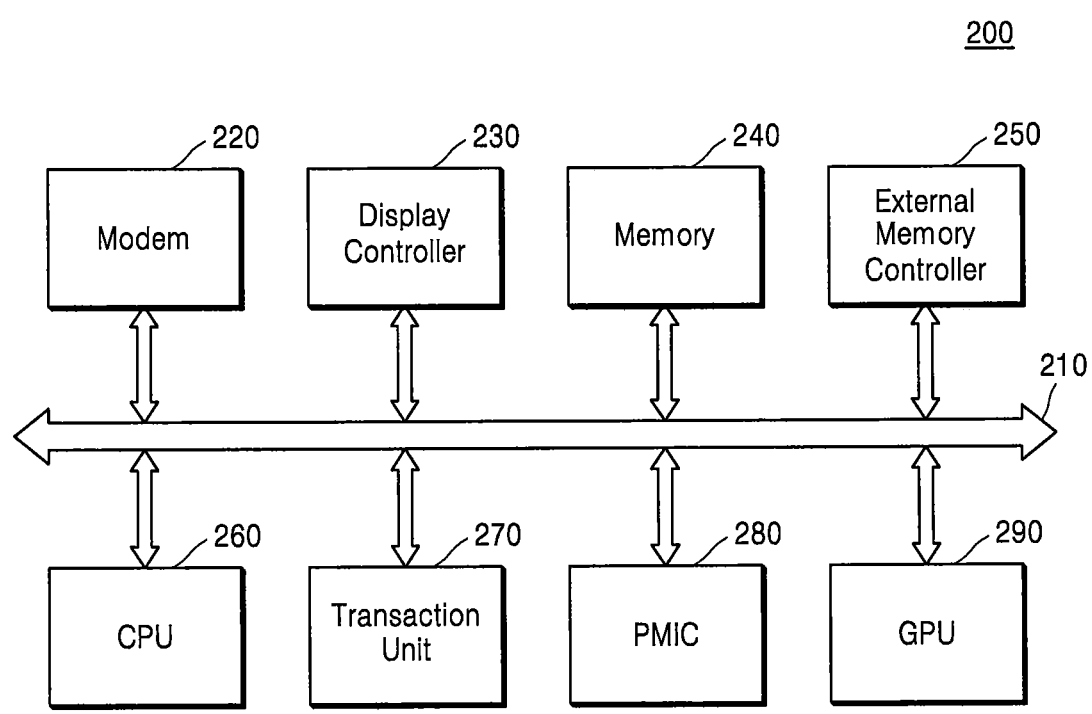
FIG. 11 is a block diagram of a system-on chip (SoC) according to an example embodiment of the inventive concepts.

FIG. 11 is a block diagram of a System-on-Chip (SoC) 200 according to an example embodiment of the inventive concepts. The SoC 200, which may be a semiconductor device, may include an IC including a via stack according to an example embodiment of the inventive concepts. The SoC 200 may be implemented as a single chip in which complicated function blocks (e.g., an intellectual property (IP)) capable of various functions are integrated. The via stack according to the example embodiment may be included in each of the function blocks of the SoC 200. Thus, the SoC 200 having improved performance and a reduced area may be obtained due to a reduced IR drop and efficiently routed patterns.

Referring to FIG. 11, the SoC 200 may include a modem 220, a display controller 230, a memory 240, an external memory controller 250, a central processing unit (CPU) 260, a transaction unit 270, a power management integrated circuit (PMIC) 280, and a graphic processing unit (GPU) 290, and respective function blocks of the SoC 200 may communicate with each other through a system bus 210.

The CPU 260 may be configured to control the overall operation of the SoC 200 and may control operations of other function blocks of the SoC 200. The modem 220 may demodulate a signal received from the outside of the SoC 200 or modulate a signal generated from the inside of the SoC 200 and transmit the demodulated signal or the modulated signal to the outside. The external memory controller 250 may control an operation of transmitting and receiving data to and from an external memory device connected to the SoC 200. For example, a program and/or data stored in the external memory device may be provided to the CPU 260 and/or the GPU 290 via the control of the external memory controller 250. The GPU 290 may execute program instructions associated to a graphics processing operation, though the inventive concepts are not limited thereto. The GPU 290 may receive graphics data through the external memory controller 250 and/or graphics data processed by the GPU 290 may be transmitted through the external memory controller 250 to the outside of the SoC 200. The transaction unit 270 may monitor data transactions of the respective function blocks, and the PMIC 280 may control power supplied to each of the function blocks via the control of the transaction unit 270. The display controller 230 may control a display (or display device) outside the SoC 200 and transmit data generated in the SoC 200 to the display.

The memory 240 may include a non-volatile memory, such as electrically erasable programmable read-only memory (EEPROM), flash memory, phase-change random access memory (PRAM), resistive RAM (RRAM), nano-floating gate memory (NFGM), polymer RAM (PoRAM), magnetic RAM (MRAM), and ferroelectric RAM (FRAM), or a volatile memory, such as dynamic RAM (DRAM), static RAM (SRAM), mobile DRAM, double-data-rate synchronous dynamic RAM (DDR SDRAM), low-power DDR (LPDDR) SDRAM, graphic DDR (GDDR) SDRAM, and Rambus DRAM (RDRAM).

Figure 12:
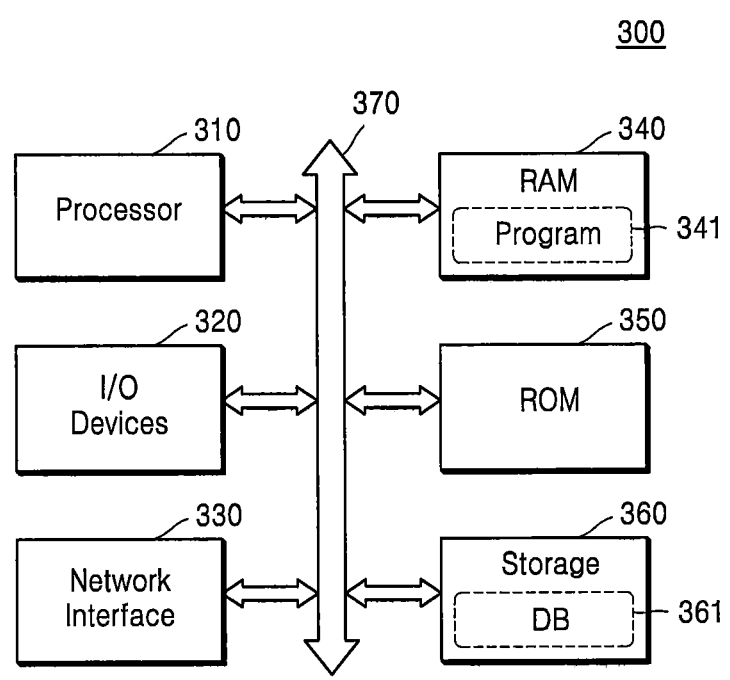
FIG. 12 is a block diagram of a computing system including a memory configured to store a program, according to an example embodiment of the inventive concepts.

FIG. 12 is a block diagram of a computing system 300 including a memory 340 configured to store a program 341 according to an example embodiment of the inventive concepts. At least some of operations included in a method (e.g., the method shown in FIG. 8) of fabricating an IC according to an example embodiment may be performed by the computing system 300.

The computing system 300 may be a fixed computing system, such as a desktop computer, a workstation, and a server, or a portable computing system, such as a laptop computer. As shown in FIG. 12, the computing system 300 may include a processor 310, input/output (I/O) devices 320, a network interface 330, a random access memory (RAM) 340, a read-only memory (ROM) 350, and/or a storage device 360. The processor 310, the I/O devices 320, the network interface 330, the RAM 340, the ROM 350, and the storage device 360 may be connected to a bus 370 and communicate with each other through the bus 370.

The processor 310 may be referred to as a processing unit. For example, the processor 310 may include at least one core (e.g., a microprocessor (MP), an application processor (AP), a digital signal processor (DSP), and a graphic processing unit (GPU)), which may execute an arbitrary instruction set (e.g., Intel Architecture-32 (IA-32), 64-bit extension IA-32, x86-64, PowerPC, Sparc, MIPS, ARM, IA-64, and the like). For example, the processor 310 may access a memory (i.e., the RAM 340 and/or the ROM 350) through the bus 370 and execute commands stored in the RAM 340 and/or the ROM 350.

The RAM 340 may store a program 341 for manufacturing an IC according to an example embodiment and/or at least a portion of the program 341. The program 341 may enable the processor 310 to perform at least some of operations included in a method of manufacturing an IC. That is, the program 341 may include a plurality of commands that may be executed by the processor 310. The plurality of commands included in the program 341 may enable the processor 310 to perform, for example, a logic synthesis operation of operation S200 of FIG. 8 and/or a P&R operation of operation S400 of FIG. 8.

Even if power supplied to the computing system 300 is interrupted, the storage device 360 may not lose stored data. For example, the storage device 360 may include a non-volatile memory device or a storage medium, such as a magnetic tape, an optical disc, and a magnetic disc. Also, the storage device 360 may be detachably attached to the computing system 300. In some embodiments, the storage device 360 may store the program 341 according to an example embodiment. Before the program 341 is executed by the processor 310, the program 341 or at least a portion thereof may be loaded from the storage device 360 into the RAM 340. In some embodiments, the storage device 360 may store a file written in a program language, and the program 341 generated by a compiler or at least a portion thereof may be loaded from the file into the RAM 340. Also, as shown in FIG. 12, the storage device 360 may store a database (DB) 361, which may include information (e.g., the standard cell library D12 and/or the design rule D14 of FIG. 8) that may be used to design an IC.

The storage device 360 may store data to be processed by the processor 310 and/or data processed by the processor 310. That is, according to the program 341, the processor 310 may process data stored in the storage device 360 to generate data, and/or store generated data in the storage device 360. For example, the storage device 360 may store the RTL data D11, the netlist data D13 and/or the layout data D15 of FIG. 8.

The I/O devices 320 may include an input device, such as a keyboard and/or a pointing apparatus, and/or an output device, such as a display device and/or a printer. For example, via the I/O devices 320, a user may trigger the execution of the program 341 using the processor 310, input the RTL data D11 and/or the netlist data D13 of FIG. 8, and/or confirm the layout data D15 of FIG. 11.

The network interface 330 may provide access to a network outside the computing system 300. For example, the network may include a plurality of computing systems and a plurality of communication links. The communication links may include wired links, optical links, wireless links, or links of other arbitrary types.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the inventive concepts have been particularly shown and described with reference to embodiments thereof, it will be understood that various changes in form and details may be made therein without departing from the spirit and scope of the following claims.

What is claimed is:

1. An integrated circuit comprising:
    a first conductive layer comprising conductive patterns on first tracks extending parallel to each other in a first lateral direction, the conductive patterns on the first tracks comprising a first conductive pattern and primary conductive patterns;
    a second conductive layer comprising conductive patterns on second tracks extending parallel to each other in a second lateral direction orthogonal to the first lateral direction, the conductive patterns on the second tracks comprising a second conductive pattern and a third conductive pattern; and
    a first via array comprising a first via and a second via, wherein the first via is connected to a top surface of the first conductive pattern and a bottom surface of the second conductive pattern, and wherein the second via is connected to the top surface of the first conductive pattern and a bottom surface of the third conductive pattern,
    wherein each of the first conductive pattern, the first via, and the second via has a width in the second lateral direction that is greater than a width of the primary conductive patterns on the first tracks of the first conductive layer in the second lateral direction, and
    wherein a center of the first conductive pattern is aligned with a central line between two adjacent first tracks of the first tracks of the first conductive layer and the width of the first conductive pattern satisfies equation $(2nP-M-2S<W\leq(2n+1)P-M-2S)$, or the center of the first conductive pattern is aligned with one of the first tracks of the first conductive layer and the width of the first conductive pattern satisfies equation $((2n+1)P-M-2S<W\leq(2n+2)P-M-2S)$,
    wherein M and P respectively represent the width of the primary conductive patterns and a pitch of the first tracks of the first conductive layer, S represents a shortest distance between the conductive patterns of the first conductive layer, W represents the width of the first conductive pattern in the second lateral direction, and n is a positive integer.

2. The integrated circuit of claim 1, wherein the first conductive pattern, the first via, and the second via have a same width in the second lateral direction.

3. The integrated circuit of claim 1, wherein a first pitch between the first via and the second via is an integer multiple of a second pitch between the second tracks of the second conductive layer, and wherein the first pitch is greater than the second pitch.

4. The integrated circuit of claim 1, further comprising:
    a third conductive layer comprising conductive patterns on third tracks extending parallel to each other in the first lateral direction, the conductive patterns on the third tracks comprising a fourth conductive pattern and secondary conductive patterns; and
    a third via and a fourth via, wherein the third via is connected to a top surface of the second conductive pattern and a bottom surface of the fourth conductive pattern, and wherein the fourth via is connected to a top surface of the third conductive pattern and the bottom surface of the fourth conductive pattern.

5. The integrated circuit of claim 4, wherein each of the fourth conductive pattern, the third via, and the fourth via has a width in the second lateral direction that is greater than a width of the secondary conductive patterns on the third tracks of the third conductive layer in the second lateral direction, and
wherein a center of the fourth conductive pattern is aligned with one of the third tracks of the third conductive layer or aligned with a central line between two of the third tracks of the third conductive layer.

6. An integrated circuit comprising:
a first conductive layer comprising conductive patterns on first tracks extending parallel to each other in a first lateral direction, the conductive patterns on the first tracks comprising a first conductive pattern and primary conductive patterns;
a second conductive layer comprising conductive patterns on second tracks extending parallel to each other in a second lateral direction orthogonal to the first lateral direction, the conductive patterns on the second tracks comprising a second conductive pattern and a third conductive pattern; and
a first via array comprising a first via and a second via, wherein the first via is connected to a top surface of the first conductive pattern and a bottom surface of the second conductive pattern, and wherein the second via is connected to the top surface of the first conductive pattern and a bottom surface of the third conductive pattern,
wherein each of the first conductive pattern, the first via, and the second via has a width in the second lateral direction that is greater than a pitch of the first tracks of the first conductive layer, and
wherein a center of the first conductive pattern is aligned with one of the first tracks of the first conductive layer and the width of the first conductive pattern satisfies equation $((2n+1)P-M-2S < W \leq (2n+2)P-M-2S)$, or the center of the first conductive pattern is aligned with a central line between two adjacent first tracks of the first tracks of the first conductive layer and the width of the first conductive pattern satisfies equation $(2nP-M-2S < W \leq (2+1)P-M-2S)$,
wherein M and P respectively represent a width of the primary conductive patterns and the pitch of the first tracks of the first conductive layer, S represents a shortest distance between the conductive patterns of the first conductive layer, W represents the width of the first conductive pattern in the second lateral direction, and n is a positive integer.

7. The integrated circuit of claim 6, wherein the first conductive pattern, the first via, and the second via have a same width in the second lateral direction.

8. The integrated circuit of claim 6, wherein a first pitch between the first via and the second via is an integer multiple of a second pitch between the second tracks of the second conductive layer, and wherein the first pitch is greater than the second pitch.

9. The integrated circuit of claim 6, further comprising:
a third conductive layer comprising conductive patterns on third tracks extending parallel to each other in the first lateral direction, the conductive patterns on the third tracks comprising a fourth conductive pattern and secondary conductive patterns; and
a third via and a fourth via, wherein the third via is connected to a top surface of the second conductive pattern and a bottom surface of the fourth conductive pattern, and wherein the fourth via is connected to a top surface of the third conductive pattern and the bottom surface of the fourth conductive pattern.

10. The integrated circuit of claim 9, wherein the fourth conductive pattern has a width in the second lateral direction that is greater than a pitch of the third tracks of the third conductive layer, and
wherein a center of the fourth conductive pattern is aligned with one of the third tracks of the third conductive layer or aligned with a central line between two of the third tracks of the third conductive layer.

11. An integrated circuit comprising:
a first conductive layer comprising conductive patterns on first tracks extending parallel to each other in a first lateral direction, the conductive patterns on the first tracks comprising a first conductive pattern and primary conductive patterns;
a second conductive layer comprising conductive patterns on second tracks extending parallel to each other in a second lateral direction orthogonal to the first lateral direction, the conductive patterns on the second tracks comprising a second conductive pattern and a third conductive pattern; and
a first via array comprising a first via and a second via, wherein the first via is connected to a top surface of the first conductive pattern and a bottom surface of the second conductive pattern, and wherein the second via is connected to the top surface of the first conductive pattern and a bottom surface of the third conductive pattern,
wherein a center of the first conductive pattern is aligned with a central line between two adjacent first tracks of the first tracks of the first conductive layer,
wherein the first conductive pattern has a width in the second lateral direction that is greater than a pitch of the first tracks of the first conductive layer, and
wherein the width of the first conductive pattern in the second lateral direction is less than twice the pitch of the first tracks of the first conductive layer.

12. The integrated circuit of claim 11, wherein the first via and the second via have a width in the second lateral direction that is greater than the pitch of the first tracks of the first conductive layer.

13. The integrated circuit of claim 11, wherein centers of the first via and the second via are aligned with the central line between the two adjacent first tracks of the first conductive layer.

14. The integrated circuit of claim 11, wherein a first pitch between the first via and the second via is an integer multiple of a second pitch between the second tracks of the second conductive layer, and wherein the first pitch is greater than the second pitch.

15. The integrated circuit of claim 11, further comprising:
a third conductive layer comprising conductive patterns on third tracks extending parallel to each other in the first lateral direction, the conductive patterns on the third tracks comprising a fourth conductive pattern; and
a third via and a fourth via, wherein the third via is connected to a top surface of the second conductive pattern and a bottom surface of the fourth conductive pattern, and wherein the fourth via is connected to a top surface of the third conductive pattern and the bottom surface of the fourth conductive pattern.

16. The integrated circuit of claim 15, wherein the fourth conductive pattern has a width in the second lateral direction that is greater than a pitch of the third tracks of the third conductive layer, and wherein a center of the fourth conductive pattern is aligned with one of the third tracks of the third conductive layer or aligned with a central line between two of the third tracks of the third conductive layer.

17. The integrated circuit of claim 1, wherein the width of the first conductive pattern in the second lateral direction is greater than the pitch of the first tracks of the first conductive layer, but is less than twice the pitch of the first tracks of the first conductive layer.

18. The integrated circuit of claim 6, wherein the width of the first conductive pattern in the second lateral direction is less than twice the pitch of the first tracks of the first conductive layer.

* * * * *